(12) United States Patent
Libres

(10) Patent No.: US 6,432,749 B1
(45) Date of Patent: Aug. 13, 2002

(54) METHOD OF FABRICATING FLIP CHIP IC PACKAGES WITH HEAT SPREADERS IN STRIP FORMAT

(75) Inventor: Jeremias P. Libres, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 40 days.

(21) Appl. No.: 09/643,646

(22) Filed: Aug. 22, 2000

Related U.S. Application Data

(60) Provisional application No. 60/150,449, filed on Aug. 24, 1999.

(51) Int. Cl.[7] .......................... H01L 21/44; H01L 21/48; H01L 21/50
(52) U.S. Cl. .................. 438/122; 438/106; 438/127
(58) Field of Search ................................. 438/106, 121, 438/122, 127

(56) References Cited

U.S. PATENT DOCUMENTS 6,025,642 A * 2/2000 Burns ........................ 257/686
6,049,123 A * 4/2000 Burns ........................ 257/686
6,168,970 B1 * 1/2001 Burns ........................ 438/106

* cited by examiner

*Primary Examiner*—David Nelms
*Assistant Examiner*—Renee R. Berry
(74) *Attorney, Agent, or Firm*—Gary C. Honeycutt; Fred Telecky; Arthur I. Navarro

(57) ABSTRACT

Methods for fabricating plastic molded thermally enhanced flip chip packages in which the heat spreaders are assembled in strip format is disclosed, including the first step of providing the heat spreader strip. Inclusion of heat spreaders in strip format allows better automation of the molding process using equipment and fabrication technology known in the industry, and provides a cost effective solution to assembly of high density area array packages. The design of heat spreaders include reduced cross section connecting straps which are readily severed and leave only a small plastic to metal interface for ingress of contamination. Further the designs comprehend either embedded or exposed heat spreaders with methods to hold securely during the molding process.

10 Claims, 4 Drawing Sheets

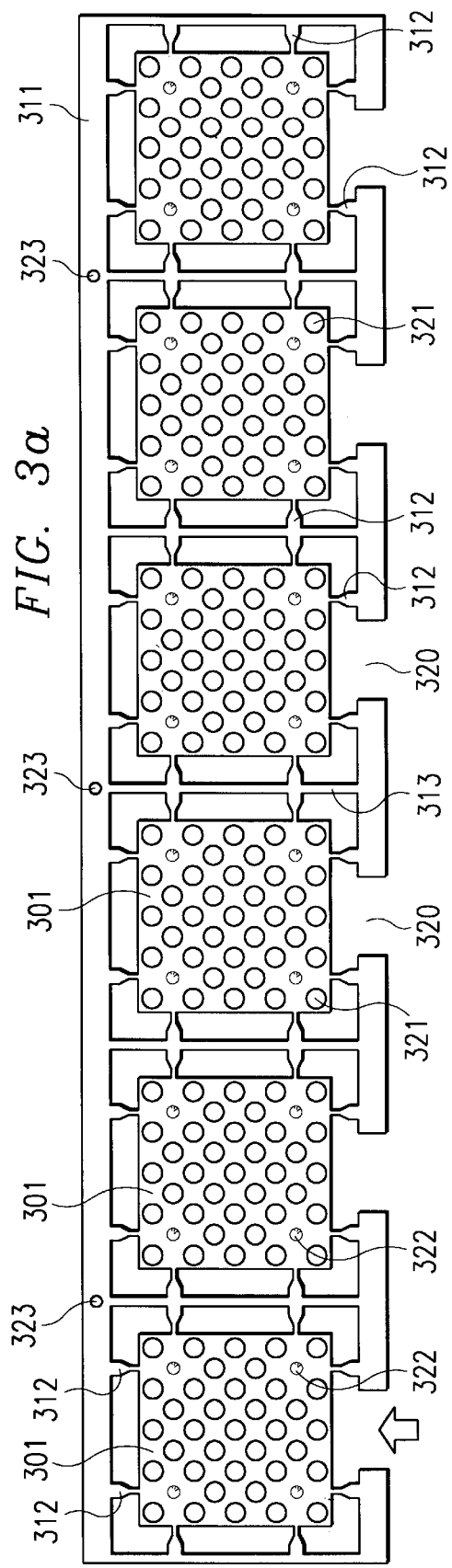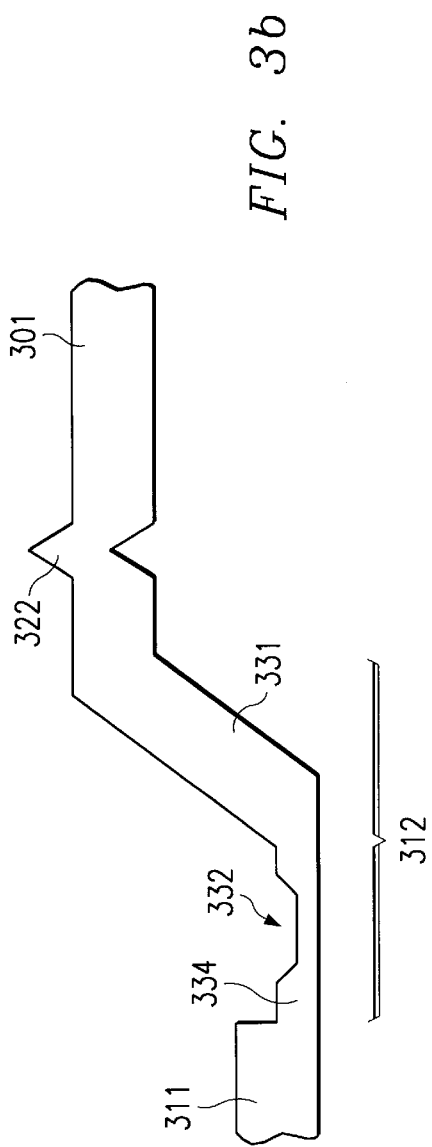
FIG. 3a
FIG. 3b

METHOD OF FABRICATING FLIP CHIP IC PACKAGES WITH HEAT SPREADERS IN STRIP FORMAT

This application claims priority under 35 USC § 119 based upon Provisional Patent Application number 60/150,449, filed 08/24/99.

FIELD OF THE INVENTION

The present invention relates generally to a method of fabricating plastic encapsulated integrated circuits and more specifically to flip chip devices with heat spreaders.

BACKGROUND OF THE INVENTION

Integrated circuit chips are being fabricated with ever smaller geometries and higher circuit densities. The power consumption associated with these more dense circuits has also increased, thereby increasing the thermal transport requirements of the package housing the chip. Further, as the volume of integrated circuits has grown, more cost-effective packages are being developed. In order to meet that need, highly automated techniques for encapsulating the devices in plastic molding compounds continues to evolve. However, thermal properties of such packages has been limited, and has led to attempts to improve the thermal performance.

In conventional thermal transport arrangements of plastic molded packages, a thermoconductive structure has been positioned close to or against the integrated circuit chip, and has been partially of fully encapsulated by a plastic molding compound which is filled with an electrically insulating particles. Package designs make use of conduction, convection and radiation to spread and remove the heat from the circuit junction. In some devices, as shown in FIG. 1a, one surface of the heat sink 101 has been exposed through the package encapsulation 102 in order to provide a direct path for transfer of heat from the integrated circuit chip 105 assembled on the die pad of a metal lead frame 108 to a printed circuit board (not shown). Exposed heat sink packages have been developed where the heat path has been directed through the bottom of the package to board, or through the top of the package to the ambient or to an attached heat sink. In cases of more moderate thermal requirements, the chip has been attached to a thermally conductive structure simply to spread the heat over an area larger than that of the chip, and the heat spreader encapsulated within the package. No precise rules have been developed to define the differences, but in general, heat spreaders and heat sinks differ in that heat spreaders may be thinner than heat sinks, and spreaders may be encapsulated within the package, as opposed to having an a major surface external to the package.

Unfortunately, manufacturing methods for thermally enhanced packages, as shown in FIG. 1a, have not lent themselves to the high level of automation needed for assembly of lower cost plastic packages. A widely used method for attaching heat spreaders has been to place a single metal structure 101, such as that shown in FIG. 1b into each cavity of a mold, position a strip of lead frames with the attached integrated circuit device in the mold so that the die paddle or the chip itself comes into contact with the metal heat spreader, and to inject a thermosetting plastic molding compound to fill the mold. The method requires placing an individual heat spreader or sink in each cavity of the mold, thereby adding extra process steps, and the cycle time associated with molding a plurality of devices in strip form. Further, because the individual heat spreaders lack a clamping location, they must be of sufficient weight and thickness to hold them securely in place during molding. Despite designing the heat spreaders with positioning fingers 111 and apertures 112 for locking the mold compound, the heat spreaders often move during the molding process, and molding compound is forced in an uncontrolled manner between the heat spreader and die pad, or onto the heat spreader outside the package.

As area array and flip chip integrated circuit packages have evolved, it has become even more difficulty to economically fabricate thermally enhanced packages. With flip chip interconnections, the integrated circuit has a plurality of solder balls positioned on the active surface of the device which are attached to receiving pads on a substrate. The location of the junction on the circuit generating heat frequently does not coincide with that of the solder balls and therefore, thermal transport may be much less effective than with conventionally packaged devices where the heat transfer path is through the silicon and out the backside of the chip into a metallic lead frame. Further, the substrates for flip chip devices are seldom good thermal conductors. Elaborate schemes for attaching heat sinks have been developed for very high power devices, but for those mid-power devices in the range of 1.5 to 3.5 Watts, housed in thin, molded plastic packages, an automated method of heat spreader attachment is lacking.

Not only has power consumption of integrated circuits increased to the point that greater than 1 watt devices are very typical, but package size has become much smaller. The area has been decreased by replacing external leads with solder ball connections of area array packages, and the thickness has decreased so that a typical package is 1 mm or less. With decreasing package size, the difficulty in providing techniques for removing heat has increased considerably.

Yet another issue in fabricating plastic molded thermally enhanced integrated circuit packages is associated with the molding process itself. In thermally enhanced packages, as in FIG. 1a, high pressure within the mold cavity during encapsulation can cause warping of the heat spreaders, resulting in uncontrolled spacing between the die and thermal conductor. Further, if the heat spreader or sink has a major surface exposed for thermal transport, mold compound flashing or resin bleed onto the exposed surface can again result in inconsistent quality. Inconsistent quality in molded thermally enhanced packages may lead to yet another reliability problem, that is that contaminants and moisture may pass along the interface between the large metal pieces and the molded plastic due to poor sealing, and may migrate to the die surface where they contribute to leakage or corrosion failures. Various mechanical locking, as well as chemical adhesion promoting efforts have been proposed to minimize the problem.

Clearly a need exists for a cost effective method to fabricate reliable thermally enhanced packages where the method is consistent with the high level of automation associated with assembly of plastic packages, and in particular a need exists for a method to fabricate thermally enhanced packages for flip chip bonded devices.

SUMMARY OF THE INVENTION

In accordance with the invention, there is provided a method of fabricating a plurality of flip chip integrated circuit packages having heat spreaders assembled in strip format, and including the first step of providing the heat spreader strip assemblage. The heat spreader strip includes a series of heat spreaders connected to side rails by pillar shaped reduced cross section connectors which are readily severed to separate the packages after molding.

In a preferred embodiment of the current invention, integrated circuit packages having flip chips bonded to area array substrates are thermally enhanced by encapsulating heat spreaders in strip format. A strip of substrates and a corresponding strip of heat spreaders are positioned in a mold press, clamped at the reduced cross section connector on the heat spreader strip, and plastic encapsulant introduced. After the molding plastic has solidified, the strip is removed, and the individual packages separated at the reduced cross section contact area. Polymeric substrate strip are cut to complete separating the assembled packages.

The reduced cross section connector on the heat spreader strip minimizes the area of metal to plastic interface where it exits the plastic encapsulation, thereby minimizing the possibility of ingress of contaminants. To further enhance adhesion between metal and plastic, and to minimize the cross sectional area of metal to be severed in singulating the packages, each connector strap incorporates an elongated slit to decrease the area even more, and to provide a "u" shaped metal section within the package after being separated at the mid section of the slit. The "u" shaped inclusion in the packages serves as a dam against ingress of contamination.

The heat spreader strip is designed with openings in one side rail providing an area for flow of molding compound into each package cavity. The opposite side rail is continuous to provide the strip continuity. The continuous strip is designed with small apertures within the cross sectional area of the rail at specific locations to mate with pin locators in the mold.

The heat spreaders are offset from the plane of the side rails by sufficient height to allow clearance for the flip chip integrated circuit with solder or other connecting bumps. The offset occurs within the connector straps.

Heat spreaders of the preferred embodiment are perforated with apertures sufficiently large enough to allow molding compound to flow through and around the apertures. The perforations provide multiple locking mechanisms between the two materials, and allow the encapsulant to completely fill the space between the heat spreader and chip back surface, thereby eliminating thermally insulating air pockets.

The preferred embodiment of the current invention further includes a plurality of small cone shaped protrusions on the heat spreaders which rest against the mold cavity, thereby maintaining the position of the heat spreader within the package vertically, and yet creating only very small areas of metal exposure in the encapsulation at the point of the cones, again minimizing paths for ingress of contaminants.

Alternate embodiments include assembly of packages with exposed heat spreaders, and using heat spreader strips having solid rather than perforated heat spreaders. Further, the strip heat spreader technology is amenable to fabricating high-density designs with multiple packages across the width of a strip by providing a means for positioning mold compound runners. Leaded plastic packages are assembled using heat spreaders in strip format by providing electrically insulating connectors between the heat spreader and side rails to eliminate shorting to the lead frame.

Heat spreader strip designs and methods of use support automation of fabricating molded flip chip packages, with the accompanying cost reductions in labor and cycle time, while providing reliable and predictable thermally enhanced packages.

The drawings constitute a part of this specification and include exemplary embodiments of the invention which may be embodied in various forms. It is to be understood that in some instances aspects of the invention may be shown exaggerated or enlarged to facilitate understanding of the invention.

BRIEF DESCRIPTION OF THE DRAWINGS

FIG. 3a illustrates a top view of a strip of perforated heat spreaders of the current invention.

FIG. 3b gives a schematic elevational view of the connector between a heat spreader and a side rail.

DETAILED DESCRIPTION OF PREFERRED EMBODIMENTS

Figure 1A:
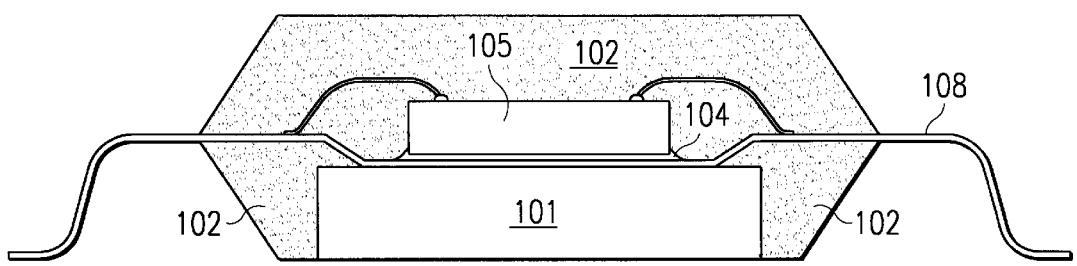
FIG. 1a shows a cross sectional view of a molded plastic surface mount package with a neat spreader. (Prior art)
Figure 1B:
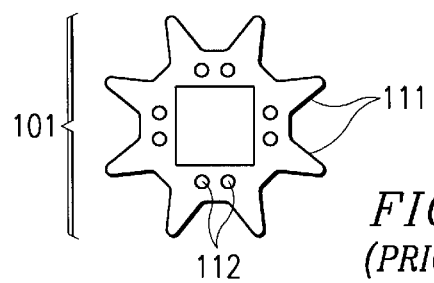
FIG. 1b shows details of an individual heat spreader design for a plastic molded package.
Figure 2A:
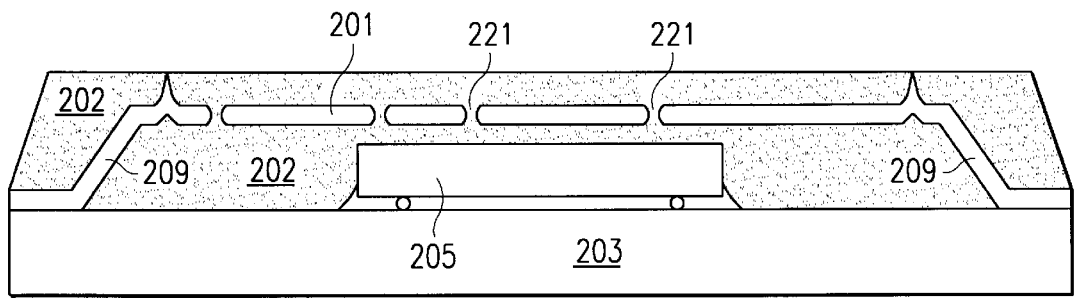
FIG. 2 illustrates a cross sectional view of an area array package and an embedded heat spreader of the current invention.

FIG. 2a provides a cross sectional view of one plastic molded area array package fabricated using the method of the current invention, wherein a plurality of thermally enhanced packages are concurrently assembled in strip format. Each package includes a flip chip interconnected integrated circuit 205 attached to a substrate 203, and a perforated 221 heat spreader 201 with a plurality of connectors 209 embedded within the package encapsulant 202.

State-of-the-art flip chip area array packages includes a substrate of a reinforced polymeric material such as FR-4 or FR-5, or a flexible polymer of the polyimide family, such as Kapton or Upilex with metallized chip receiving pads and interconnection traces on the first surface, connected through vias to pads on the second surface where solder balls provide interconnection to the next level of interconnection, such as a printed wiring board. The chip is electrically and mechanically connected by means of solder or other conductive bumps to the substrate. An underfill material, typically a polymeric material filled with insulating particles fills the space between the chip and substrate in an attempt to minimize stresses on the flip chip interconnections resulting from thermal mechanical mismatches between those materials. The chip and top side of the substrate assemblage are encapsulated by injection molding with a filled with a thermosetting polymer. Lacking any highly thermally conductive materials and planes, there are limited means to dissipate heat generated during circuit operation, and therefore, the package is usually limited to devices which dissipate less than one watt of power.

However, introduction of a relatively large, thermally conductive structure in close proximity to the chip can serves to spread the heat and allow it to be dissipated by convection and radiation, as well as conduction. An effective conductor which is larger in area the chip and approaches that of the substrate can enhance the thermal capabilities significantly. A most widely used thermally conductive material for heat spreaders in molded package is copper, or an alloy of copper, owing both to its good thermal conductivity and to a coefficient of thermal expansion which is reasonably close to that of filled plastic molding compounds. State-of-the-art area array packages are typically 1 mm or less thickness, and therefore both the package thickness, and the expansion mismatches require that the heat spreader thickness be kept small.

A molded area array IC package of a preferred embodiment illustrated in FIG. 2 includes the features discussed for a state-of-the-art thermally enhanced flip chip package, but the method of fabrication provides concurrent assembly of a plurality of devices made possible by a providing a series of heat spreaders in strip format. The first step in the method provides heat spreaders in strip format.

FIG. 3a shows the top view of a preferred configuration for a strip of heat spreaders of the current invention. A strip of copper or copper alloy in the range of 0.1 to 0.4 mm thickness, and the approximate width of an area array integrated circuit package, typically in the range of 10 to 40 mm, is punched or etched to form a series of heat spreaders 301 having a first and a second major surface. The length of the strip conforms to the mold design and is typically in the range of about 4.5 to 7 inches in length. Strips of heat spreaders are fabricated using technology found in lead frame processing, and which may include continuous reel or strip format manufacturing.

The heat spreaders 301 are connected to a continuous side rail 311 by an array of reduced cross section pillar connectors 312. The same type of pillar connectors 312 are used to connect each heat spreader to a portion of a second side rail on the opposite side. The second side rail has openings 320 which provide clearance through which the mold compound runner system feeds encapsulant into each package cavity. A third and fourth group of pillar connectors from the heat spreaders contact tie structures 313 which connect the first and second side rails.

Each heat spreader is greater in area than the chip size, but slightly smaller than the area of the package substrate or outer perimeter. Preferably the heat spreaders are perforated with an array of apertures 321 of sufficient diameter for molding compound to flow readily and evenly through the apertures 321/221 and to fill the space between the heat spreader and chip backside, as shown in FIG. 2. The apertures are in the range of 1.3 to 2.0 mm in diameter. Perforated heat spreaders have approximately the same thermal transport characteristics as the solid spreaders of the same area and thickness.

A cone shaped protrusion 322 from the first surface of the structure is located near each corner of the heat spreader. She purpose of the protrusions is to contact the surface of the mold cavity holding the spreader in place vertically, and to aid the spreader to spring back from the mold after the encapsulating compound has solidified.

A series of locator holes 323 positioned in the first side rail 311 align with locator pins in the mold to position the strip within the mold.

FIG. 3b gives a schematic elevational view of a partial heat spreader 301 connected to a side rail 311. It can be seen that the reduced cross section pillar structure 312 connecting the heat spreader to side rail has been thinned near the rail at point 332 where it will exits the package. Thinning may be accomplished by coining, punching or etching the copper material.

It can also be seen that the pillar connecting structure 312 has been formed vertically at an angle so that the heat spreader assemblage will be above the plane of the side rail, and will be of sufficient height to allow clearance for a flip chip device. The elevation is in the range of 0.4 to 0.7 mm. The side rails and wider portion 334 of the connector structure are supported horizontally within the mold, and the thinner, pillar 331 section is formed at an angle vertically.

In FIG. 3b, one of the protrusions 322 extending from the first surface of the heat spreader is illustrated as having been formed by punching material from the backside of the spreaders.

Figure 4:
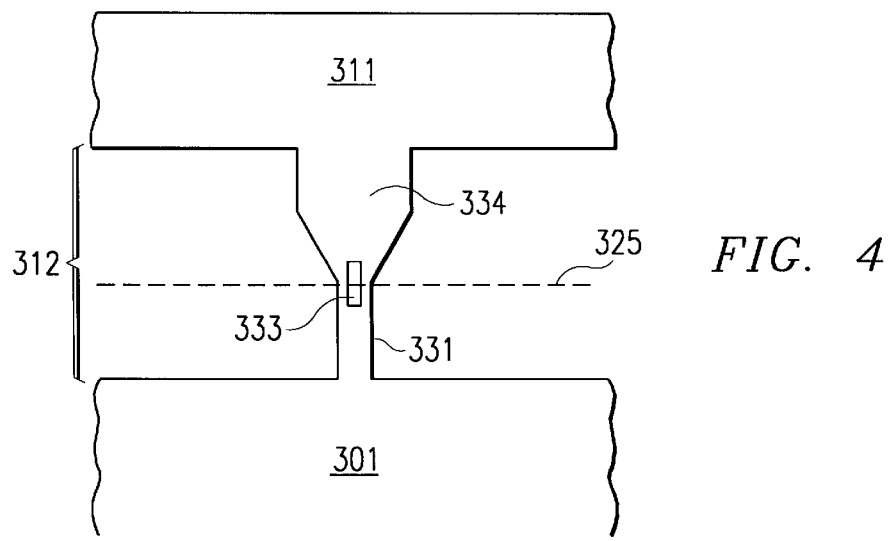
FIG. 4 provides a detailed illustration of the connection between side rail and heat spreader.

FIG. 4 provides a detailed illustration of the connector structure 312, along with a portion of the side rail and heat spreader. The heat spreader 301 is attached to a very narrow pillar section 331 of the connector, whose width is in the range of 0.1 to 0.2 mm. An elongated slit 333 is centered horizontally in the pillar structure and is positioned lengthwise to coincide with the molded package edge as illustrated by the dashed line 325. The slit is located in the same area as the thinned portion of the pillar, illustrated in FIG. 3b at point 332. The slit consumes about one half the width of the pillar, and is in the range of 0.05 to 0.07 mm, which in turn leaves the remaining section of the pillar on either side of the slit in the range of 0.03 to 0.05 mm. The thinned, narrow portions of the pillar connector alongside the slit allow the individual packages to be separated after molding with minimal effort. The small cross sectional area reduces the metal to plastic interface as it exits the package, thereby minimizing the possibility for ingress of contaminants into the package. After molding the connector is severed at the reduced cross sectional area in the slit. The severed ends of the slit forms a "u" shaped structure with the open end facing the package edge which further serves as a dam to inhibit the ingress of contamination.

At the wide section 334 of the connection structure attached to the side rail 311, the metal section is approximately three times as wide as at the pillar section 331, thereby providing added stability between the side rail and heat spreader.

A preferred method for concurrently assembling a plurality of flip chip integrated circuits package by using heat spreaders in strip format includes the following steps. A plurality of integrated circuit chips having solder bump contacts are attached to the first surface of an equal number of area array Package substrates in strip format. The substrates preferably comprise a polymeric film having patterned copper interconnections and chip pads on the first surface. The second major surface of the substrate includes an array of metallized pads for solder balls to provide a means to contact an external circuit. An underfill material fills the voids between the chip and the first surface of the substrate to provide stability to the bump contacts.

Figure 5A:
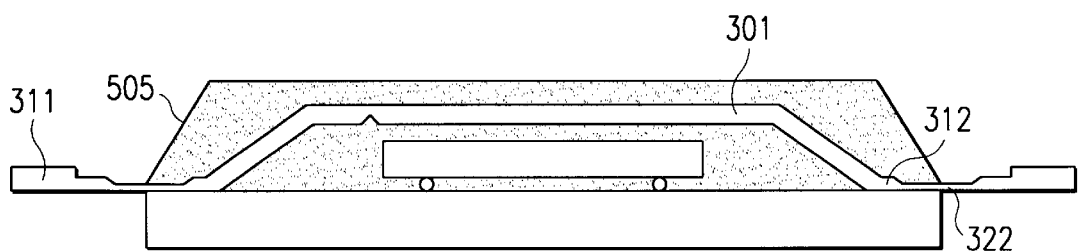
FIG. 5a illustrates a molded package before separating from the side rails.
Figure 5B:
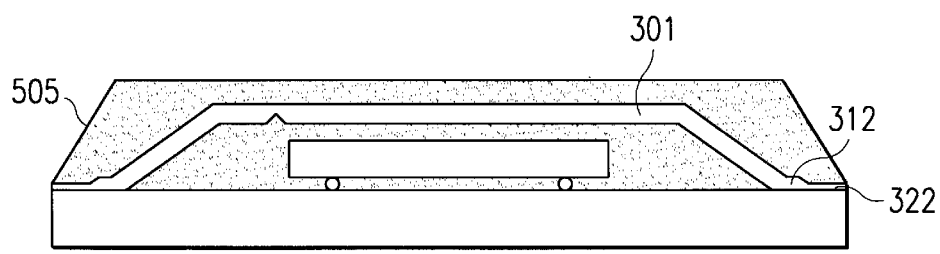
FIG. 5b illustrates a molded package after separating from the side rails.

The strip of substrates with attached chips is positioned in an injection mold press, preferably a mold lined with a vacuum held polymeric film, such as PTFE. The mold is of the type commercially available from Yamada Corp. of Japan under the name FAME. A strip of heat spreaders, described in FIG. 3a and 3b is positioned atop the first surface of the substrates, with apertures 323 aligned to locator pins in the mold. The mold is clamped at the thinned cross-sectional portion 322 of the pillar connector 312, and on the substrate. A thermosetting plastic is injected into the mold completely encapsulating the heat spreaders, the chic and the first surface of the substrate. After the molding compound has solidified, the strips are removed from the mold and the packages separated by cutting the substrates and bending at the reduced cross sectional area 332 of the connectors on the-heat spreaders. FIGS. 5a and 5b provide a cross sectional view of a molded packages before and after separation from the side rails. In FIG. 5a, the side rails 311 are connected to the heat spreader 301 by the pillar connectors 312, and the edge of the encapsulating plastic mold compound 505 coincides with the reduced cross sectional portion 322 of the pillar connector. In FIG. 5b, showing the finished package, the side rail has been severed at the thin, narrow portion 322 of the pillar connector, exposing only the small ends of the slit in the pillar connector.

The preferred embodiment of the current invention provides a plastic film lined mold press having technical advantages in clamping onto the small connectors because where the film provides an excellent seal, and avoids resin bleed or flashing, and further the film supports ease of release from the mold.

Technical advantages of the method of fabricating thermally enhanced flip chip packages shown in FIG. 2 wherein the embedded heat spreader is in strip format as shown in FIGS. 3a and 3b, include automation of heat spreader loading by pick and place equipment known and used throughout the industry for loading strips of lead frames. It provides further advantages in ease of separating the packages from side and support rails at the thin, narrow cross sectional pillar connectors, in ease of ejecting packages from the mold resulting from protrusions on the second surface of the heat spreader provide a spring like action to help push the packages from the mold, and in flow of mold compound through perorations in the spreaders to minimize the tendency of the large, thin spreaders to warp or tilt in during molding. The features of the method and strip design support automation with cost reduction in time and labor, and provide a reliable package. The strip fabrication method and equipment required for package assembly are well known in the industry.

Figure 6:
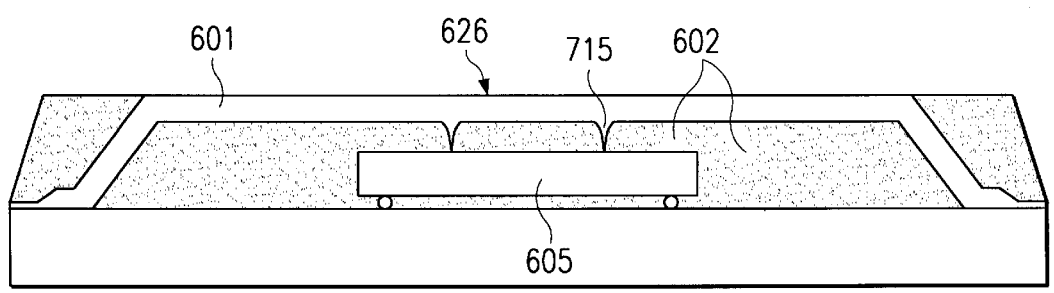
FIG. 6 illustrates a cross sectional view of an area array package and an exposed heat spreader of the current invention.

FIG. 6 illustrates an alternate embodiment of the current invention including a flip chip integrated circuit 605 package assembled from a heat spreader 601 in strip format, and having the second surface 626 of the heat spreader exposed through the package encapsulant. A first step in the assembly method is to provide heat spreaders in strip format, and a top view of the device of this embodiment is given in FIG. 7. The strip differs from the one previously described in FIG. 3a in that the heat spreaders 701 comprise a solid piece of copper, rather than perforated, the connector ties 712 are longer for the required additional vertical rise to the package surface, and protrusions, as indicated by an array of circles 715 extend from the second surface of the heat spreaders, and are positioned near the center of the heat spreaders.

Preferably the heat spreaders strips comprise copper or a copper alloy, in the range 0.1 to 0.4 mm thickness and 10 to 40 mm width and the length of the mold. Pillar type connectors with reduced cross sectional areas, having a slit in each connector are of the same design as that shown in FIG. 4. The narrow pillar section 731 which directly contacts the heat spreader 701 are in the range of 0.5 to 0.8 mm in length. Length of the pillars is determined by chip thickness coupled with the bump height, and by package design thickness. The heat spreaders include an array of stand-off protrusions 715 from the second surface which are positioned in the area of chip placement.

Figure 7:
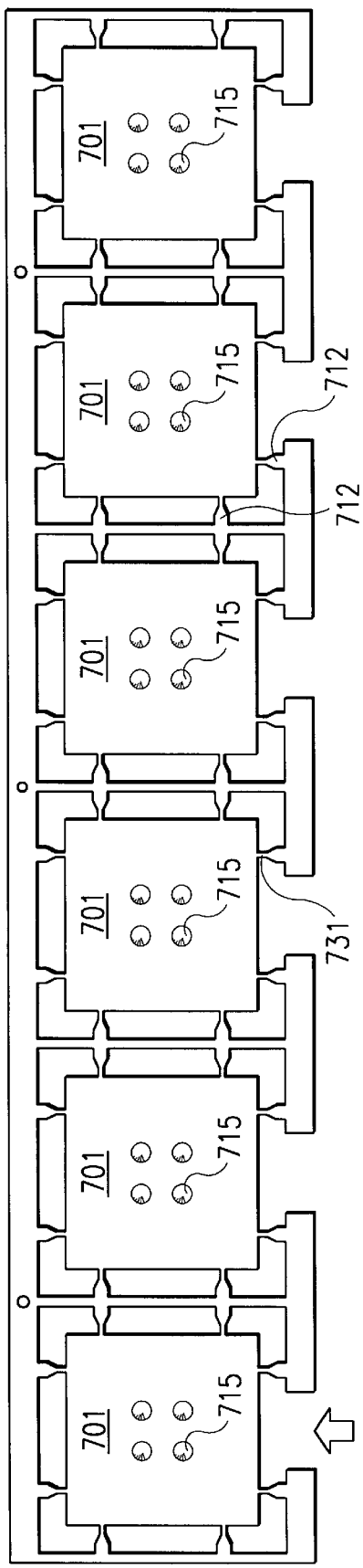
FIG. 7 illustrates a top view of a strip of solid heat spreaders of the current invention.

The method of assembly includes positioning a strip of heat spreaders as in FIG. 7 over the unpatterned surface of a flip chip integrated circuit using stand-off structures 715 to control the spacing between the heat spreader and chip. During the molding process, the viscous plastic encapsulant 602 is forced under pressure between the chip and heat spreader as illustrated in FIG. 6. The molding compound serves to adhere the structure and to replace air, thereby supporting thermal transfer to the heat spreader.

Figure 8:
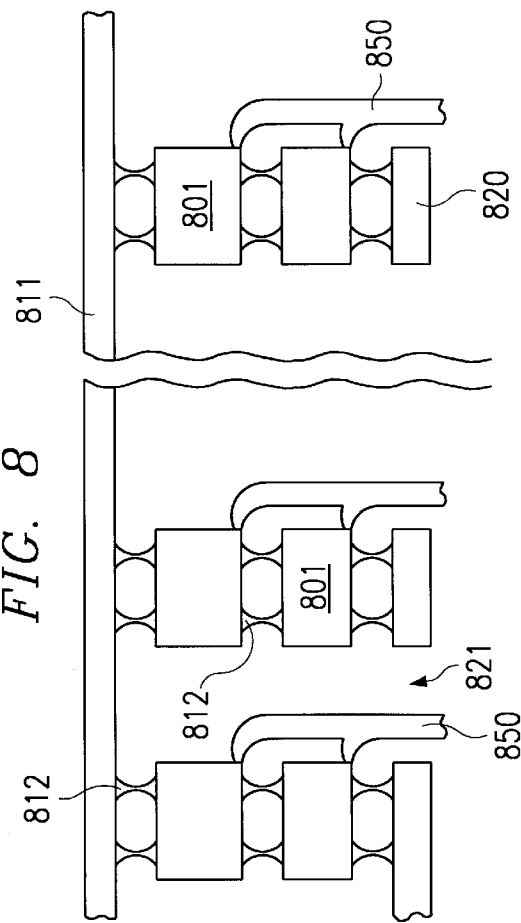
FIG. 8 illustrates adjacent heat spreaders in strip format for high-density packages.

In yet another embodiment of the current invention, high-density packaging is supported by providing a strip of heat spreaders having multiple heat spreaders arrayed horizontally across the width of a strip. Smaller IC packages are typically fabricated on substrate or lead frame strips having 2 or 3 packages positioned adjacent to each other along the width of a strip. For area array packages with solid substrates where the molding compound can enter the mold only from a single surface, it is difficult to provide a runner system to feed each package. The difficulty is increased by the addition of a strip of heat spreaders. FIG. 8 illustrates an embodiment of a strip of heat spreaders of the current invention having openings 821 in the second side-rail 820 through which runners 850 for mold compound can fill each of the adjacent individual cavities. The small heat spreaders 801 are tied to each other, to the first continuous side rail 811, and to the second side rail 820 by two or more pillar connectors 812 having reduced cross-sectional areas.

In the previously discussed embodiments, the IC packages have included flip chip rather than wire bonded interconnections and have been devoted to area array external connections rather than leaded packages. For IC packages fabricated with lead frames, the strips of perforated or solid heat spreaders for either embedded or exposed spreaders are connected by electrically non-conductive polymeric connectors to the side rails and tie structures. Non-conductive connectors are required to avoid shorting of the connectors to any portion of the lead frame. Narrow strips of a rigid polyimide based film having a thermoplastic adhesive are well suited for heat staking the heat spreader to the support rail system and for providing a clamping position on the film which can be severed readily. Such materials are chemically and thermally stable and have been used previously inside IC packages for different purposed. Thermally conductive materials such as metals or ceramics provide the heat spreading portions of the strip and the support rails are typically a metal of the same composition as the lead frame within the package, in order to avoid a thermal expansion mismatch.

The invention has been described in connection with preferred embodiments, but it is not intended to limit the scope to a particular form set forth, but on the contrary, it is intended to cover alternatives, modifications and equivalents as may be included within the spirit of the invention as defined by the appended claims.

What is claimed is:

1. A method for fabricating a plurality of plastic encapsulated IC packages having embedded heat spreaders incorporated in strip format, including the steps of;
   a) providing a strip of heat spreaders comprising;
      a plurality of copper or copper alloy heat spreaders having a first major surface and a second major surface attached to two side rails by an array of reduced cross section pillar connectors,
      the first of said side rails providing a continuous element about the length of the mold, and the second of said side rails having a series of openings coinciding with the mold press runners, said pillar connectors formed vertically to elevate the individual heat spreader above the plane of said rails, b) positioning in a mold press a polymeric strip having a plurality of patterned IC package substrates with a flip chip connected integrated circuit attached to each substrate, c) positioning a strip of said heat spreaders atop the substrate and chip assemblage, and d) injecting a thermosetting plastic molding compound to fill the mold cavity at each package, and e) removing the molded strip from said mold press and separating each package by severing at the substrate and at the reduced cross section pillar connector.

2. A method as in claim 1 wherein the first side rail included a plurality of locating holes.

3. A method as in claim 1 wherein each individual heat spreader has an array of perforations.

4. A method as in claim 1 wherein each heat spreader includes an array of protrusions from the second surface.

5. A method as in claim 1 wherein said reduced cross section pillar connectors includes a slit approximately equal to one-half the width of the most narrow portion of said connector.

6. A methods as in claim 1 wherein the area of each heat spreader is equal to or greater than the area of the integrated circuit chip and is less than the area of the package substrate.

7. A method as in claim 1 wherein the thickness of said heat spreaders is the range of 0.10 to 0.40 mm.

8. A method for fabricating a plurality of plastic encapsulated IC packages having embedded heat spreaders incorporated in strip format, including the steps of;

a) providing a strip of heat spreaders comprising;
   a plurality of perforated copper or copper alloy heat spreaders in the range of 0.1 to 0.4 mm thickness, and equal to or larger than said chip and smaller than said substrate, having a first major surface and a second major surface,
   said heat spreaders attached,to two side rails by an array of reduced cross section pillar connectors having an elongated slit in the most narrow portion,
   said heat spreaders having an array of cone shaped protrusions from the second surface,
   the first of said side rails comprises a continuous element about the length of the mold having locator holes, and the second side rails having a series of openings coinciding with the mold press runners,
   each of said individual heat spreader is elevated above the plane of said rails, b) positioning in a mold press a polymeric strip having a plurality of patterned IC package substrates with a flip chip connected integrated circuit attached to each substrate, c) positioning a strip of said heat spreaders atop said substrate and chip assemblage, and d) injecting a plastic molding compound to fill the mold cavity at each package, and e) removing the molded strip from said mold press and separating each package by severing at the substrate and at the reduced cross section pillar connector.

9. A method for fabricating a plurality of plastic encapsulated IC packages having exposed heat spreaders incorporated in strip format, comprising the steps of;

a) providing a strip of heat spreaders comprising;
   a plurality of copper or copper alloy heat spreaders having a first major surface and a second major surface attached to two side rails by an array of reduced cross section pillar connectors,
   the first of said side rails comprises a continuous element about the length of the mold, and the second side rails having a series of openings coinciding with the mold press runners,
   said pillar connectors formed vertically to elevate each of said individual heat spreader above the plane of said rails, b) positioning in a mold press a polymeric strip having a plurality of patterned IC package substrates with a flip chip connected integrated circuit attached to each substrate, c) positioning a strip of heat spreaders atop said substrate and chip assemblage, and d) injecting a plastic molding compound to fill the mold cavity at each package, and e) removing the molded strip from said mold press and separating each package by severing at the substrate and at the reduced cross section pillar connector.

10. A method as in claim 9 wherein each individual heat spreader comprises a solid piece of copper or copper alloy in the range of 0.1 to 0.4 mm thickness.

* * * * *